(12) United States Patent
Shin

(10) Patent No.: US 6,996,027 B2
(45) Date of Patent: Feb. 7, 2006

(54) SYNCHRONOUS MEMORY DEVICE

(75) Inventor: Beom-Ju Shin, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 28 days.

(21) Appl. No.: 10/876,412

(22) Filed: Jun. 25, 2004

(65) Prior Publication Data
US 2005/0249026 A1 Nov. 10, 2005

(30) Foreign Application Priority Data
May 6, 2004 (KR) .................. 10-2004-0031909

(51) Int. Cl.
*G11C 8/00* (2006.01)
(52) U.S. Cl. ................. 365/233; 365/194; 365/198; 365/230.03; 365/230.05
(58) Field of Classification Search ............... 365/194, 365/198, 230.03, 230.05
See application file for complete search history.

(56) References Cited

U.S. PATENT DOCUMENTS 6,359,815 B1 * 3/2002 Sato et al. ............. 365/198

2004/0076044 A1 * 4/2004 Nowshadi ............. 365/200
2005/0137966 A1 * 6/2005 Munguia et al. ............. 705/38

* cited by examiner

*Primary Examiner*—Hoai Ho
(74) *Attorney, Agent, or Firm*—Blakely Sokoloff Taylor & Zafman

(57) ABSTRACT

A synchronous memory device and a synchronous multi-port memory device preventing a skew between data and data strobe signal according to data transmission path is disclosed. In order to eliminate such a position dependence, the synchronous memory device and the synchronous multi-port memory device adopt a scheme of transmitting the data strobe signal together with the data. If a data driving block transmits the data capture pulse together with the data, the data and the data capture pulse pass the same delay without regard to the data transmission/reception blocks, thus preventing the occurrence of the skew. In other words, the present invention adopts a source synchronization scheme, which is used at an outside of the conventional synchronous DRAM, into the memory device. Specifically, the present invention can be applied to a synchronous multi-port memory device having a plurality of independent ports.

12 Claims, 16 Drawing Sheets

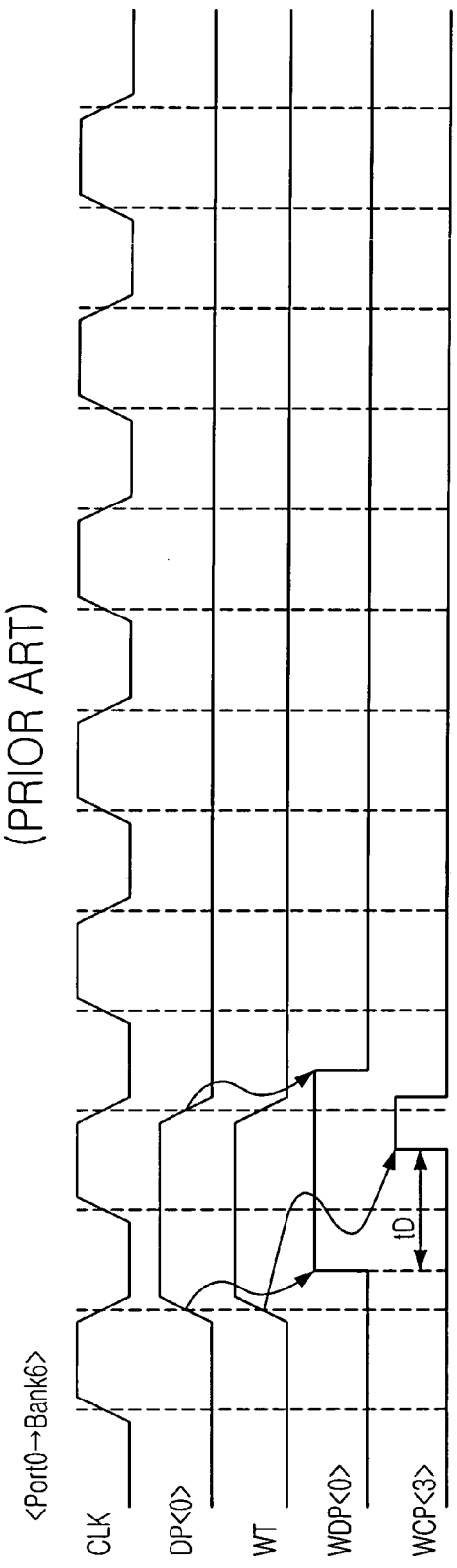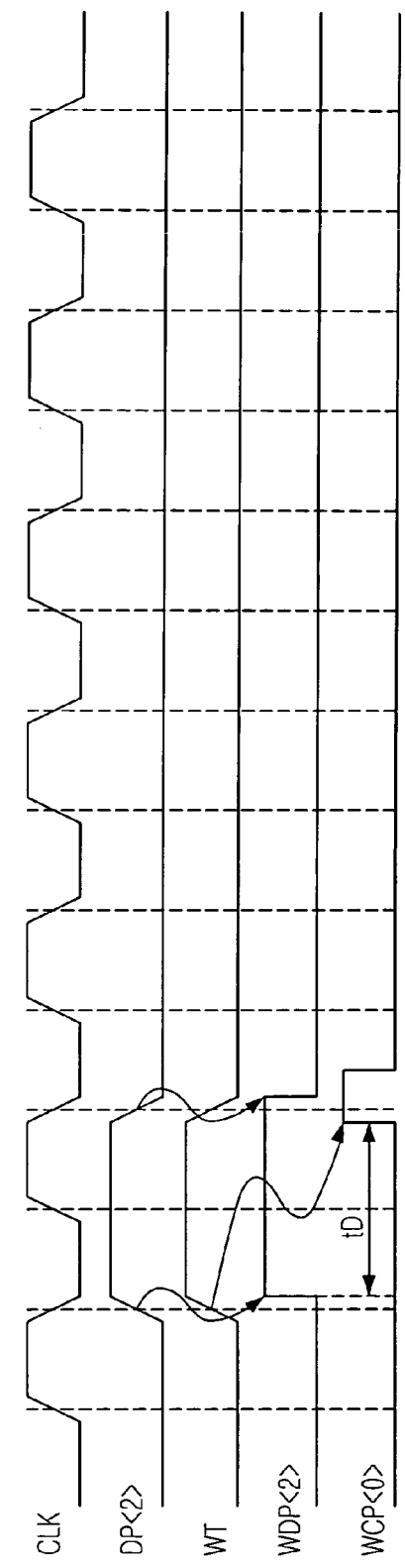

SYNCHRONOUS MEMORY DEVICE

FIELD OF THE INVENTION

The present invention relates to a semiconductor memory design technology; and, more particularly, to a data transmission scheme of a synchronous memory device.

DESCRIPTION OF RELATED ART

Most of memory devices, including a random access memory (RAM), have one port. Also, one port has a plurality of input/output pin sets. In other words, the memory device has only one port for data exchange with chipset. However, in recent years, a function separation between the memory device and the chipset has been ambiguous and an integration of the chipset and the memory device has been considered. This tendency demands a multi-port memory device that can directly exchange data with peripheral graphic devices, CUP, and so on. In order to implement such a multi-port memory device, any one of a plurality of ports must be able to provide an access to all memory cells.

FIG. 1 is a block diagram illustrating an architecture of a 256M multi-port DRAM, which is disclosed in Korean Patent Application No. 2003-92375, filed by the same applicant on Dec. 17, 2003.

Referring to FIG. 1, the 256M multi-port DRAM includes a plurality of memory cells and a plurality of row decoders RDEC. The 256M multi-port DRAM includes a plurality of banks bank0 to bank15, a control block 100, a plurality of ports port0 to port7, first to fourth global data buses GIO_UL, GIO_UR, GIO_DL and GIO_DR, first and second global data bus connection blocks, a plurality of transfer buses TB, a plurality of transfer bus connection blocks TG, a plurality of bus connection blocks TL, and a plurality of data transfer blocks QTRX.

The plurality of banks bank0 to bank15 are arranged in a row direction (a right and left direction in the drawing) as many as a predetermined number at four divided sections (quadrants) of a core area.

The control block 100 is arranged between the first/third quadrants and the second/fourth quadrants to divide the core area into two sections. The control block 100 generates an internal command signal, an internal address signal and a control signal using an inputted command, addresses, and so on, and controls respective elements of the memory device.

The plurality of ports port0 to port7 are arranged at edge portions of the respective quadrants and perform an independent communication with different target devices.

The first to fourth global data buses GIO_UL, GIO_UR, GIO_DL and GIO_DR are arranged between each bank and each port corresponding to the respective quadrants in a row direction and perform a parallel data transmission.

The first and second global data bus connection blocks PR_U and PR_D are arranged between two global data buses, which are adjacent to each other in a row direction, and selectively connect the two global data buses.

The plurality of transfer buses TB are arranged in a column direction (an up and down direction in the drawing) of each bank and perform a data transmission inside the banks.

The plurality of transfer bus connection blocks TG arranged between two banks, which are adjacent to each other in a column direction, and selectively connect the two transfer buses TB.

The plurality of bus connection blocks TL are arranged between each bank and each global data bus of the quadrant in which each bank is contained, and perform a data exchange between the corresponding transfer bus TB and the corresponding global data bus.

The plurality of data transfer blocks QTRX are arranged between each port and each global data bus of the quadrant in which each port is contained, and perform a data transmission/reception between the corresponding port and the corresponding global data bus.

A detailed structure of the 256M multi-port DRAM will now be described.

Each of the sixteen banks bank0 to bank15 includes 16M DRAM cells (8k(row) 2k(column)) and the row decoder RDEC. Each bank includes a core circuit, such as a bit line sense amplifier and an equalizer, which is necessary in a typical DRAM core. The banks bank0 to bank15 are arranged at the four quadrants, each of which includes four banks in a row direction. In detail, the banks bank0, bank2, bank4 and bank6 are arranged at the first quadrant (a left and up section) of the core area, and the banks bank8, bank10, bank12 and bank14 are arranged at the second quadrant (a right and up section). Also, the banks bank1, bank3, bank5 and bank7 are arranged at the third quadrant (a left and down section), and the banks bank9, bank11, bank 13 and bank15 are arranged at the fourth quadrant (a right and down section). Meanwhile, it is preferable that each row decoder RDEC is arranged to pair a row decoder RDEC of an adjacent bank at one side of each bank. One page (column) is divided into four segments, each of which consists of 512 cells.

The control block 100 generates internal command signals, internal address signals, and control signals using the command and addresses, which are transmitted in a packet form, and controls the respective elements of the memory device. Here, the internal command signals include an internal activation command signal (ACT), an internal inactivation command signal (PCG), an internal read command signal (RD), an internal write command signal (WD), and so on. The internal address signals include an activation array address (AAA), an inactivation array address (PAA), a read array address (RAA), a write array address (WAA), a row address (RA), a read segment address (RSA), a write segment address (WSA), and so on. The control signals include a transfer gate control signal (TGC), a pipe register flag signal (PRFG), a pipe register data driving signal (DP), a DRAM core test mode flag signal (DTM), and so on.

The ports port0 to port7 are arranged at die edge portions of the respective quadrants, each of which includes two ports. The die edge portion means a major axis portion shared by all banks of the corresponding quadrant. In detail, the ports port0 and port2 are arranged at the first quadrant, and the ports port4 and port6 are arranged at the second quadrant. The ports port1 and port3 are arranged at the third quadrant, and the ports prot5 and port7 are arranged at the fourth quadrant. Each port supports a serial I/O interface and performs an independent communication with different target devices (for example, chipset, graphic chip, etc.). Meanwhile, in case where the ports port0 to port7 are configured to support the serial I/O interface, each of the ports port0 to port7 includes a plurality of pads corresponding to data, addresses and commands, a pad buffer (a read buffer, a write buffer) for buffering transmission/reception signals transferred to the pad, a decoder for decoding the received data, an encoder for encoding the data to be transmitted, and a data converter for converting a received serial data into a parallel data and converting a parallel data to be transmitted into a serial data.

The first global data bus GIO_UL is arranged between the banks and the ports of the first quadrant, and the second global data bus GIO_UR is arranged at the second quadrant. The third global data bus GIO_DL is arranged at the third quadrant, and the fourth global data bus GIO_DR is arranged at the fourth quadrant. The first to fourth global data buses GIO_UL, GIO_UR, GIO_DL and GIO_DR are bi-directional data buses (512 bits), which are connected to the banks, ports and global data bus connection blocks PR_U and PR_D of the corresponding quadrants, respectively.

Meanwhile, the first and second global data buses GIO_UL and GIO_UR can be connected to each other through the first global data bus connection block PR_U, and the third and fourth global data buses GIO_DL and GIO_DR can be connected to each other through the second global data bus connection block PR_D. The first and second global data bus connection blocks PR_U and PR_D include bi-directional pipe registers corresponding to the number (512) of the lines of the global data buses.

Also, the transfer buffers TB are local data buffers for connecting the bit line sense amplifiers and the bus connection blocks TL of the corresponding banks. The number of the lines of the transfer buses TB is identical to the number (for example, 512) of the cells corresponding to one segment and the transfer buses TB are configured with differential buses.

The transfer bus connection blocks TG can be configured with MOS transistors, the number of which is identical to the number of the lines of the transfer buses TB. Because the transfer buses TB are the differential buses, one transfer bus connection block TG can be configured with 512 pairs of MOS transistors. For this reason, the transfer bus connection block TG is called a transfer gate.

Also, the bus connection block TL includes a total of sixteen sets, each of which is 512 transfer latches. Each of the transfer latches is provided with a read bus connection circuit (an I/O sense amplifier of DRAM) and a write bus connection circuit (a write driver of DRAM). Here, the read bus connection circuit includes a read sense amplifier for sensing and latching a read data, which is applied on the transfer bus TB, and a read driver for driving the latched data to the global data bus of the quadrant to which the corresponding bank belongs. The write bus connection circuit includes a write latch for sensing and latching a write data, which is applied on the global data bus, and a write driver for driving the write data to the transfer bus TB.

The data transfer block QTRX includes a transmitter (QTx) for transmitting a write data applied on a corresponding port to the global data bus, and a receiver (QRx) for receiving a read data applied from the global data bus and transmitting the read data to a corresponding port.

Although not shown in the drawing, the 256M multi-port DRAM further includes a voltage generator, a test logic, and a variety of pads. The voltage generator is arranged at each edge portion of the die and is configured to receive an external voltage to generate an internal voltage. The test logic is arranged between the ports corresponding to the first and second quadrants and between the ports corresponding to the third and fourth quadrants. The pads include a clock pad arranged at the edge portion of the die.

Command lines (ACT, PCG, RD, WD) and address lines (AAA<0:1>, PAA<0:1>, RAA<0:1>, RA<0:12>, RSA<0:1>), which extend from the control block 100 to the corresponding banks, are provided at the respective quadrants. Transfer gate control lines (TGC<0:3>) extending from the control block 100 to the transfer bus connection block TG are provided at the right and left sides of the control block 100.

FIG. 2 is a block diagram illustrating the segment and the transfer bus TB in the 256M multi-port DRAM of FIG. 1.

Referring to FIG. 2, like a general DRAM, the 256M multi-port DRAM includes a plurality of memory cell arrays 200 and a plurality of bit line sense amplifier arrays 210. In view of one memory cell array 200, a pair of transfer buses TB<0> and TBb<0> are connected to four bit line sense amplifiers BLSA that are arranged at upper and lower portions of the memory cell array 200 (refer to a box A). The four bit line sense amplifiers BLSA are controlled by different segment selection signals SGS<0:3>. The segment selection signal is a signal corresponding to a column selection signal (Yi) of the general DRAM. In case of 2k columns, if one row and one segment are selected, 512 cells are selected at the same time, such that data exchange with the corresponding 512-bit transfer buses TB<0:511> is achieved.

Meanwhile, the transfer buses TB corresponding to each bank of the first quadrant can be connected through the transfer gates TG to the transfer buses TB corresponding to each bank of the third quadrant, which is arranged on the same column axis (512 transfer gates TG are configured as one set and a total of 8 sets are provided). In other words, the transfer gates TG are arranged between the transfer buses TB corresponding to two banks (which is defined as an array) arranged on the same column axis and selectively connects two transfer buses TB. A control signal TGC for controlling the transfer gates TG is generated from the control block 100.

An operation of the 256M multi-port DRAM will now be described.

FIGS. 3A and 3B illustrate a normal read path and a normal write path of the 256M multi-port DRAM shown in FIG. 2, respectively.

First, an operation of reading out 512-bit data from a specific segment of the bank bank0 through the port port0 will be described.

Referring to FIG. 3A, if command and address related to a read operation are applied through the port port0 in a packet form, the control block 100 generates an internal activation command signal (ACT), an activation array address (AAA) and a row address (RA) for the bank bank0 and activates a specific row (word line, WL). Then, the control block 100 generates an internal read command signal (RD), a read array address (RAA) and a read segment address (RSA) for the bank bank0. The bit line sense amplifier BLSA senses and amplifies 512-bit data of a segment corresponding to the read segment address (RSA), thus driving the transfer buses TB and TBb. Meanwhile, the bus connection block TL of the bank bank0 senses a read data applied on the transfer buses TB and TBb of the bank bank0 and drives data to the first global data bus GIO_UL. Then, the read data transferred to the first global data bus GIO_UL is stored in the read buffer of the port port0 through the receiver (QRx) of the data transfer block QTRX corresponding to the port port0. The data stored in the read buffer is converted into a packet of predetermined unit and transmitted to the target device connected to the port port0 in a serial data form. Then, the control block 100 generates an internal inactivation command signal (PCG) and an inactivation array address (PAA) to inactivate the row of the corresponding array. At this time, the transfer bus connection block TG of the corresponding array becomes a switched-off state, such that the transfer buses TB and TBb of the bank bank0 are disconnected from the transfer buses TB and TBb of the bank bank1 arranged within the same array. Reference numerals "BL" and "BLb" represent bit line pair, a reference numeral "T" represents a cell transistor, and a reference numeral "C" represents a cell capacitor.

Next, an operation of writing 512-bit data to a specific segment of the bank bank0 through the port port0 will be described.

Referring to FIG. 3B, if command, address and data related to a write operation are applied through the port port0 in a packet form, the control block 100 generates an internal activation command signal (ACT), an activation array address (AAA) and a row address (RA) for the bank bank0 and activates a specific row (word line, WL). Then, the control block 100 generates an internal write command signal (WT), a write array address (WAA) and a write segment address (WSA) for the bank bank0. At this time, 512-bit data stored in a write buffer of the port port0 are written to a segment (512 memory cells) corresponding to the write segment address (WSA) by a scheduling. The data converted into the parallel data at the port port0 are loaded on the first global data bus GIO_UL through the transmitter (QTx) of the data transfer block QTRX and are driven to the transfer buses TB and TBb of the bank bank0 through the bus connection block TL of the bank bank0. The data loaded on the transfer buses TB and TBb of the bank bank0 are stored in 512 memory cells through the bit line sense amplifiers BLSA corresponding to the write segment address (WSA). Then, the control block 100 generates an internal inactivation command signal (PCG) and an inactivation array address (PAA) to inactivate the row of the corresponding array.

FIGS. 4A and 4B illustrate a cross read path and a cross write path of the 256M multi-port DRAM of FIG. 2, respectively.

First, an operation of reading out 512-bit data from a specific segment of the bank bank0 through the port port1 will be described.

Referring to FIG. 4A, an overall operation is almost similar to the above-described normal read operation. A difference is that the transfer bus connection block TG of the corresponding array is in a switched-on state such that the transfer buses TB and TBb of the bank bank0 are connected to the transfer buses TB and TBb of the bank bank1 within the same array.

Meanwhile, the data loaded on the transfer buses TB and TBb of the bank bank1 are transferred to the target device through the bus transfer block TL of the bank bank1, the third global data bus GIO_DL, the data transfer block QTRX of the port port1, and the port port1 in sequence.

Next, an operation of writing 512-bit data to a specific segment of the bank bank0 through the port port1 will be described.

Referring to FIG. 4B, an overall operation is almost similar to the above-described normal write operation. A difference is that the transfer bus connection block TG of the corresponding array is in a switched-on state such that the transfer buses TB and TBb of the bank bank0 are connected to the transfer buses TB and TBb of the bank bank1 within the same array.

In this case, the data applied on the port port1 are loaded on the transfer buses TB and TBb of the bank bank0 through the bus transfer block TR of the port port1, the third global data bus GIO_DL, and the bus connection block TL of the bank bank1 in sequence. Following procedures are identical to the above-described normal write operation.

Meanwhile, in case where data exchange between the first global data bus GIO_UL and the second global data bus GIO_UR is required, the two global data buses are connected through the first global data bus connection block PR_U. In case where data exchange between the third data global data bus GIO_DL and the fourth global data bus GIO_DR is required, the two global data bus lines are connected through the second global data bus connection block PR_D.

Since the proposed 256M multi-port DRAM can access all segments at all ports port0 to port7 and also provide an independent access through a plurality of ports, a multi access is possible within a range in which the global data buses are not used overlappingly. Also, since the 256M multi-port DRAM can process 512-bit data in parallel at the respective quadrants of the core area through an application of the new architecture and can input/output data in serial at the ports. Accordingly, an increase of a layout area is minimized, a packaging is simplified, and a bandwidth is greatly increased without causing a skew between data lines at the data buses.

Although, the multi-port memory device applied to a general DRAM core is described as an example, it can be also applied to a synchronous memory device operating in synchronization with clocks inputted through a clock pad, which is arranged at an edge portion of a die. In this case, data strobe signal is used to capture data in synchronization with clock when transmitting/receiving data through global data bus (GIO).

FIG. 5 is a block diagram illustrating a first quadrant of a unit area of the 256M multi-port DRAM shown in FIG. 1.

Referring to FIG. 5, global data buses GIO_LU<0:511> of a first quadrant exchange data with four banks bank0, bank2, bank4 and bank6, two ports port0 and port2, and one global data bus connection block PR_U. Here, peripheral circuits of the corresponding quadrants receive commands from the control unit and generate data driving pulses RDP and WDP, which are used to transmit data to the global data bus GIO, and data capture pulses RCP and WCP, which are data strobe signal for receiving data from the global data bus GIO.

FIG. 6 is a block diagram illustrating a transmission structure of 1-bit data in the first quadrant shown in FIG. 5.

Referring to FIG. 6, each bank bank0, bank2, bank4 and bank6, each port port0 and port2, and the global data bus connection block PR_U include transmitters TX and receivers RX, which transmit and receive data to and from the global data bus GIO, respectively. In other words, the bank includes a transfer latch that is a unit block of the bus connection unit TL, and the port includes a transmitter and a receiver that are unit block of data transmission unit QTRX. The global data bus connection block PR_U includes a bi-directional pipe register that is a unit block to perform a transmission/reception operation.

The banks bank0, bank2, bank4 and bank4, the ports port0 and port2, and the global data bus connection block PR_U, which are connected to the global data bus GIO, include the transmitters TX and the receivers RX and operate in response to the data driving pulses RDP and WDP and the data capture pulses RCP and WCP.

For example, in case of writing data from the port port0 to bank bank4, the transmitter TX of the port port0 transmits data to the global data bus GIO when the write data driving pulse WDP is activated. The receiver RX of the bank bank4 strobes data of the global data bus GIO when the write data capture pulse WCP is activated. At this point, data driving pulses RDP and WDP and data capture pulses RCP and WCP of other blocks are all in inactivated states.

In order to correctly capture the data of the global data bus GIO, timing conditions of the write data driving pulse WDP and the write data capture pulse WCP must be satisfied.

FIG. 7 is a timing diagram in case when a port-bank write operation is performed in the circuit shown in FIG. 6 (a best case).

Referring to FIG. 7, if a port-bank write command is applied from an external circuit, the control unit generates a write command signal WT and a port/pipe register data driving signal DP<0> in synchronization with a clock CLK, and a peripheral circuit of a corresponding quadrant generates a write data driving pulse WDP<#> and a write data capture pulse WCP<#>.

At this point, when the write data driving pulse WDP<#> is activated and data is transmitted to the global data bus GIO, the write data capture pulse WCP<#> must be activated after the data reaches a bank to which the data is to be written. Also, the data of the global data bus GIO must be captured before the write data capture pulse WCP<#> is inactivated. In other words, a delay time tD until the write data capture pulse WCP<#> is activated from a time point when the write data driving pulse WDP<#> is activated must be longer than a time period taken to transmit the data from the port through the global data bus GIO to the transfer latch of the bank. As a section in which the write data driving pulse WDP<#> and the write data capture pulse WCP<#> are overlapped is wider, the capture of valid data becomes more advantageous.

In the conventional multi-port memory device, however, since the peripheral circuit generates all data driving pulses R/WDP and all data capture pulses R/WCP, the timings of the data driving pulses R/WDP and data capture pulses R/WCP may be changed according to the actual data transmission paths, as shown in FIGS. 8 and 9. That is, skew may occur between the data and the data strobe signal.

FIG. 8 is a timing diagram in case when a port (port0)-bank (bank6) write operation is performed in the circuit shown in FIG. 6 (a worst case), and FIG. 9 is a timing diagram in case when a global data bus connection block (PR_U)-bank (bank0) write operation is performed in the circuit shown in FIG. 6 (a worst case).

Referring to FIG. 8, the write data capture pulse WCP<3> is activated too fast. In other words, a time delay tD until the write data capture pulse WCP<3> is activated from a time point when the write data driving pulse WDP<0> is activated is too short. In this case, since the data is captured before the data reaches the transfer latch of the bank bank6 from the port port6 through the global data bus GIO, an incorrect data may be recognized.

Referring to FIG. 9, the write data capture pulse WCP<3> is activated too late. In other words, a time delay tD until the write data capture pulse WCP<0> is activated from a time point when the write data driving pulse WDP<2> is activated is too long. In this case, it is possible to secure enough time, which is necessary when the data reaches the transfer latch of the bank bank0 from the global data bus connection block PR_U through the global data bus GIO. However, a section in which the write data driving pulse WDP<2> is maintained in an activated state after the write data capture pulse WCP<0> is activated is too short, such that a margin for capturing the valid data is decreased.

SUMMARY OF THE INVENTION

It is, therefore, an object of the present invention to provide a synchronous memory device which is capable of preventing an occurrence of skew between data and data strobe signal according to data transmission path.

It is another object of the present invention to provide a synchronous memory device which is capable of preventing an occurrence of skew between data and data strobe signal according to data transmission path.

In an aspect of the present invention, there is provided a semiconductor memory device, which includes: a global data bus; a plurality of data transmission/reception block including a transmitter and a receiver for transmitting and receiving data to and from the global data bus, respectively; a data driving/capture pulse generating means, arranged at each data transmission/reception block, for generating data driving pulse for a transmitter of a corresponding data transmission/reception block and data capture pulse for a receiver of other data transmission/reception block in response to internal signals provided from a peripheral circuit; a data capture pulse bus for transmitting the data capture pulse among the plurality of data transmission/reception blocks; and a data capture pulse receiving means, arranged at each data transmission/reception block, for transmitting the data capture pulse of the data capture pulse bus to a receiver of a corresponding data transmission/reception block in response to internal signals provided from the peripheral circuit.

In another aspect of the present invention, there is provided a synchronous multi-port memory device, which includes: a global data bus; a plurality of data transmission/reception block including a transmitter and a receiver for transmitting and receiving data to and from the global data bus, respectively, a plurality of ports, a plurality of banks, and a global data bus connection block; a data driving/capture pulse generating means, arranged at each data transmission/reception block, for generating data driving pulse for a transmitter of a corresponding data transmission/reception block and data capture pulse for a receiver of other data transmission/reception block in response to internal signals provided from a peripheral circuit; a data capture pulse bus for transmitting the data capture pulse among the plurality of data transmission/reception blocks; and a data capture pulse receiving means, arranged at each data transmission/reception block, for transmitting the data capture pulse of the data capture pulse bus to a receiver of a corresponding data transmission/reception block in response to internal signals provided from the peripheral circuit.

Preferably, the synchronous multi-port memory device may further include at least one bi-directional repeater, which is connected to the data capture pulse bus.

Preferably, the data driving/capture pulse generating means arranged at the plurality of ports and the global data bus connection block receives a data driving signal, generates write data driving pulse to the transmitter of a corresponding port or global data bus connection, and generates the data capture pulse for the receiver of other data transmission/reception block in response to the write data driving pulse.

Preferably, the data driving/capture pulse generating means arranged at the plurality of banks receives read command signal, generates read data driving pulse for the transmitter of a corresponding bank, and generates the data capture pulse for the receiver of other data transmission/reception block in response to the read data driving pulse.

Preferably, the data capture pulse receiving means arranged at the plurality of ports and the global data bus connection block receives the data capture pulse of the data capture pulse bus in response to a flag signal and generates read data capture pulse for the receiver of the corresponding port or global data bus connection block.

Preferably, the data capture pulse receiving means arranged at the plurality of banks receives the data capture pulse of the data capture pulse bus in response to write command signal and generates write data capture pulse for the receiver of the corresponding bank.

Preferably, the data driving/capture pulse generating means arranged at the plurality of ports and the global data bus connection block includes: a first inverter for inverting the data driving signal for the port/global data bus connection block; a delay unit for delaying an output of the first inverter; a second inverter for inverting an output of the delay unit; a NAND gate having input terminals receiving the outputs of the first and second inverters; a third inverter for inverting an output of the second inverter; a fourth inverter for inverting an output of the third inverter and outputting the write data driving pulse; and a tri-state driver for inverting an output of the NAND gate and outputting the data capture pulse in response to the write data driving pulse and driving the data capture pulse bus.

Preferably, the data driving/capture pulse generating means includes: a first inverter for inverting the read command signal; a delay unit for delaying an output of the first inverter; a second inverter for inverting an output of the delay unit; a NAND gate having input terminals receiving the outputs of the first and second inverters; a third inverter for inverting an output of the second inverter; a fourth inverter for inverting an output of the third inverter and outputting the write data driving pulse; and a tri-state driver for inverting an output of the NAND gate and outputting the data capture pulse in response to the read data driving pulse and driving the data capture pulse bus.

Preferably, the data capture pulse receiving means arranged at the plurality of ports and the global data bus connection block includes: a flip-flop for latching the flag signal in synchronization with a clock signal; a NAND gate having input terminals receiving an output of the flip-flop and the data capture pulse; and an inverter for inverting an output of the NAND gate and outputting the read data capture pulse for the receiver of the corresponding port or global data bus connection block.

Preferably, the data capture pulse receiving means arranged at the plurality of banks includes: a flip-flop for latching the write command signal in synchronization with a clock signal; a NAND gate having input terminals receiving an output of the flip-flop and the data capture pulse; and an inverter for inverting an output of the NAND gate and outputting the data capture pulse for the receiver of the corresponding bank.

Skew between data and data strobe signal is caused because one peripheral circuit generates data driving pulse and data capture pulse, without regard to data transmission path. In order to eliminate such a position dependence, the present invention adopts a scheme of transmitting the data strobe signal together with the data. If a data driving block transmits the data capture pulse together with the data, the data and the data capture pulse pass the same delay without regard to the data transmission/reception blocks, thus preventing the occurrence of the skew. In other words, the present invention adopts a source synchronization scheme, which is used at an outside of the conventional synchronous DRAM, into the memory device. Specifically, the present invention can be applied to a synchronous multi-port memory device having a plurality of independent ports.

BRIEF DESCRIPTION OF THE DRAWINGS

The above and other objects and features of the instant invention will become apparent from the following description of preferred embodiments taken in conjunction with the accompanying drawings, in which:

FIG. 8 is a timing diagram in case when a port0-bank6 write operation is performed in the circuit shown in FIG. 6 (a worst case);

FIG. 9 is a timing diagram in case when a global data bus connection block (PR_U)-bank (bank0) write operation is performed in the circuit shown in FIG. 6 (a best case);

DETAILED DESCRIPTION OF THE INVENTION

Hereinafter, the present invention will be described in detail with reference to the accompanying drawings.

Figure 1:
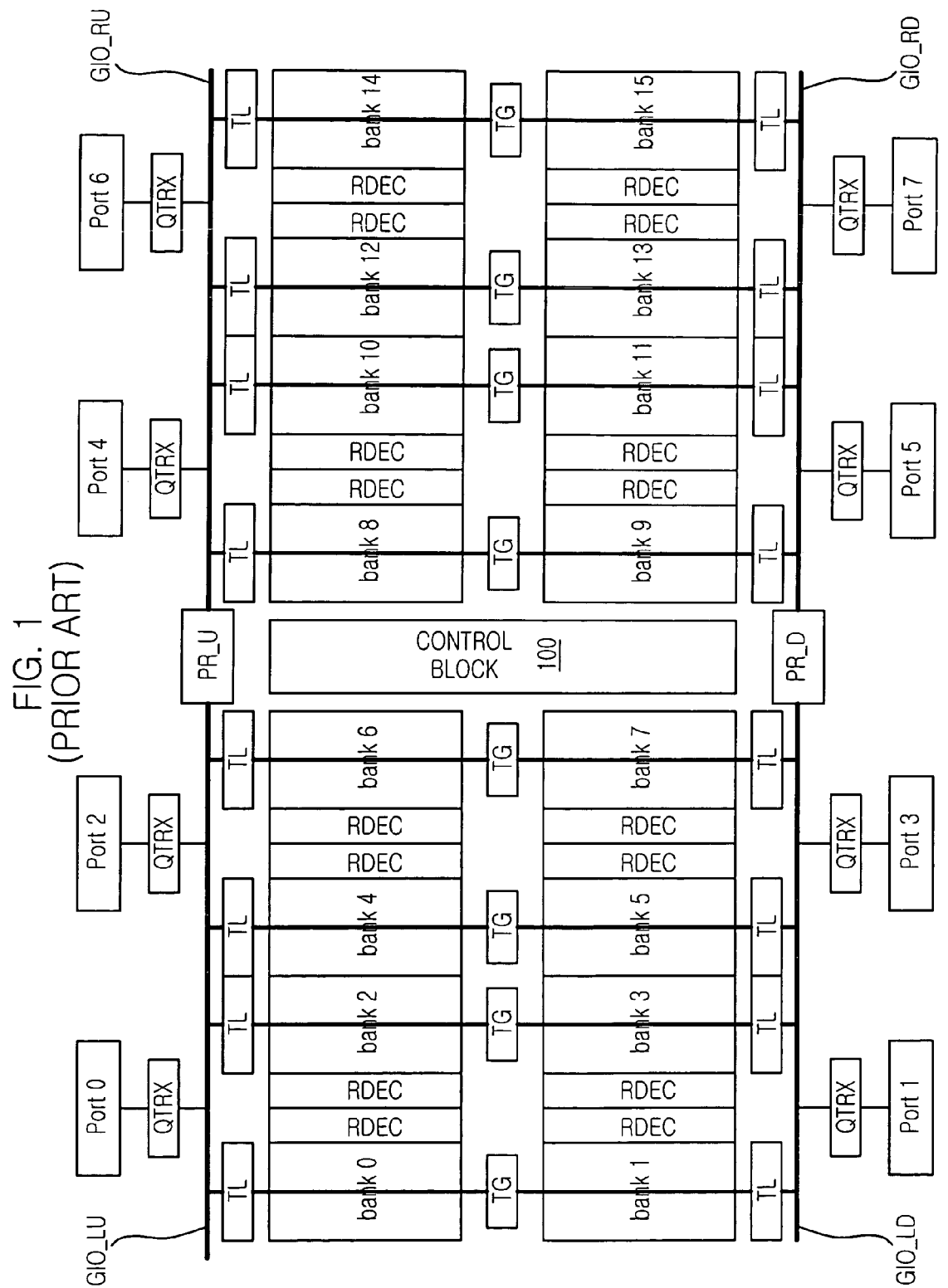
FIG. 1 illustrates an architecture of a 256M multi-port DRAM, which is disclosed in Korean Patent Application No. 2003-92375.
Figure 2:
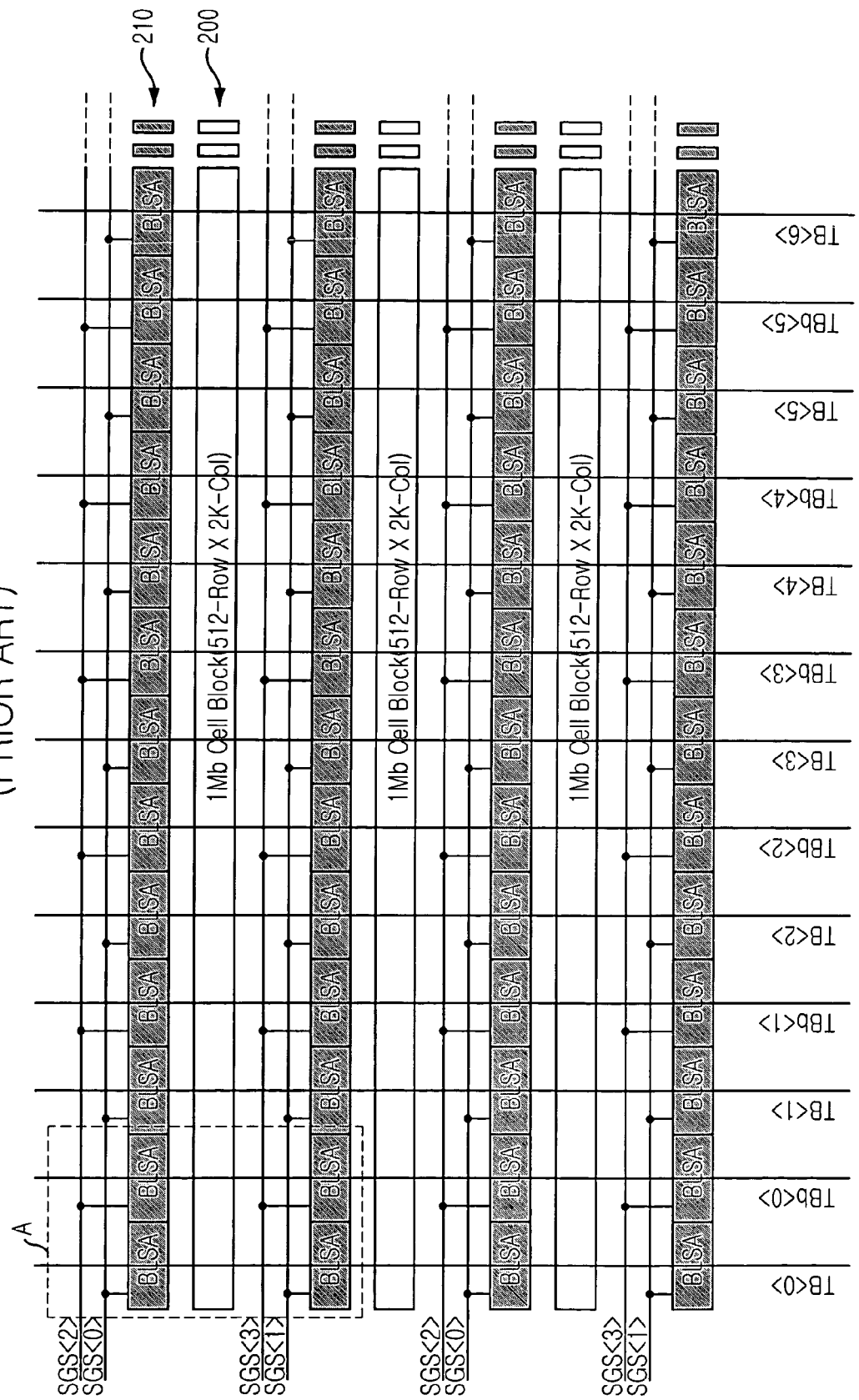
FIG. 2 is a block diagram illustrating a segment and a transfer bus in the 256M multi-port DRAM of FIG. 1.
Figure 3A:
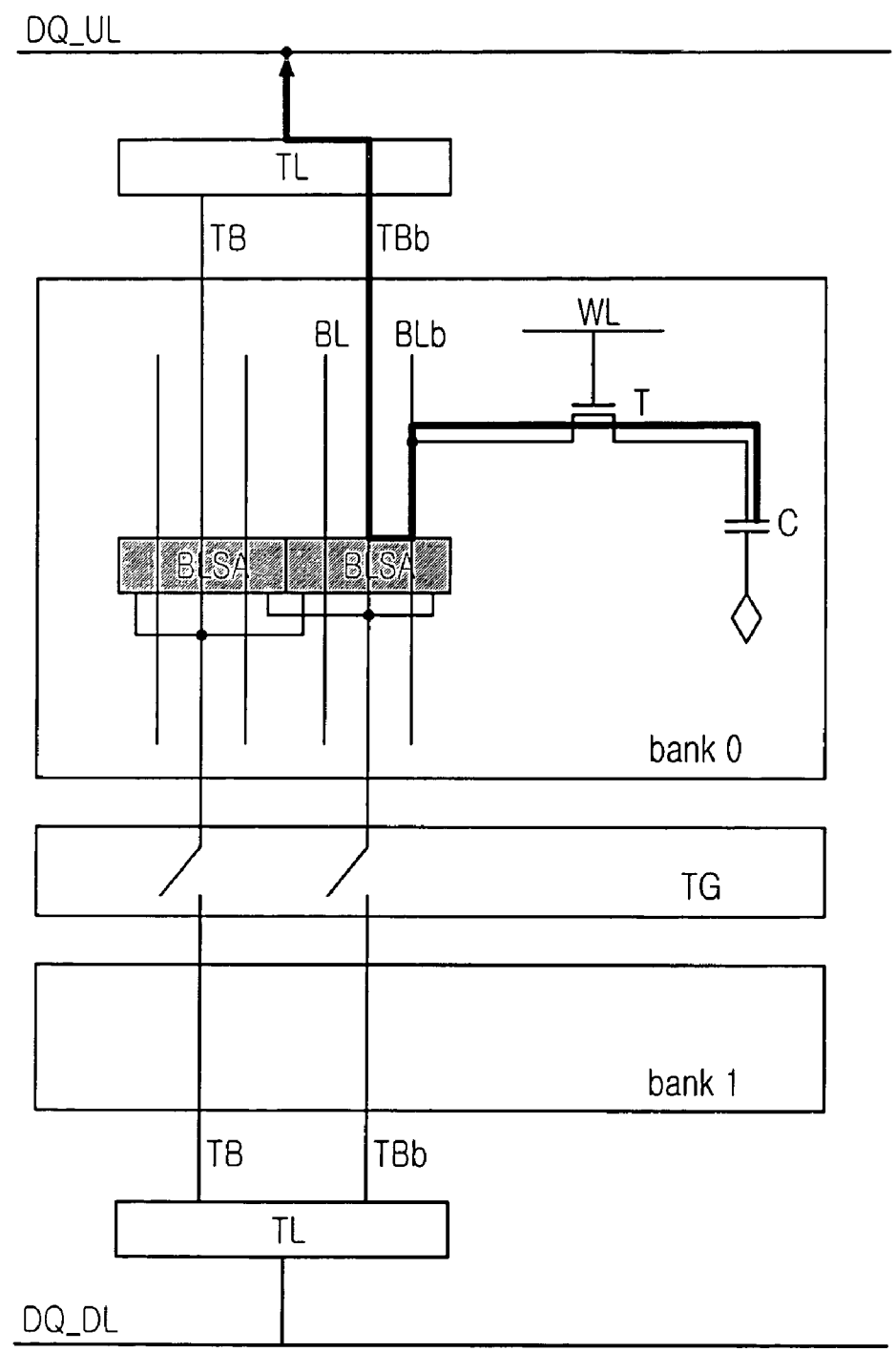
FIG. 3A illustrates a normal read path of the 256M multi-port DRAM depicted in FIG. 2.
Figure 3B:
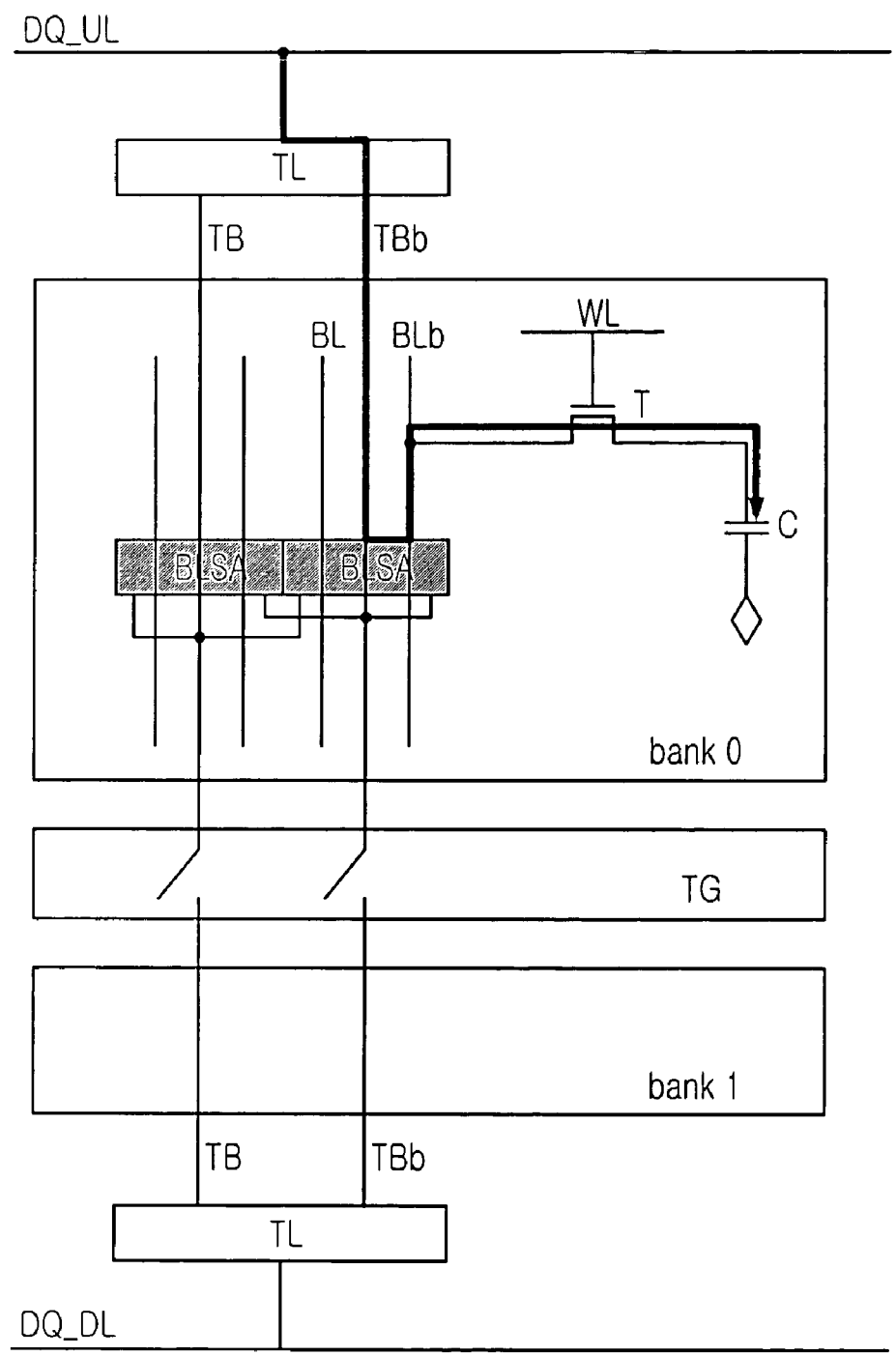
FIG. 3B illustrates a normal write path of the 256M multi-port DRAM depicted in FIG. 2.
Figure 4A:
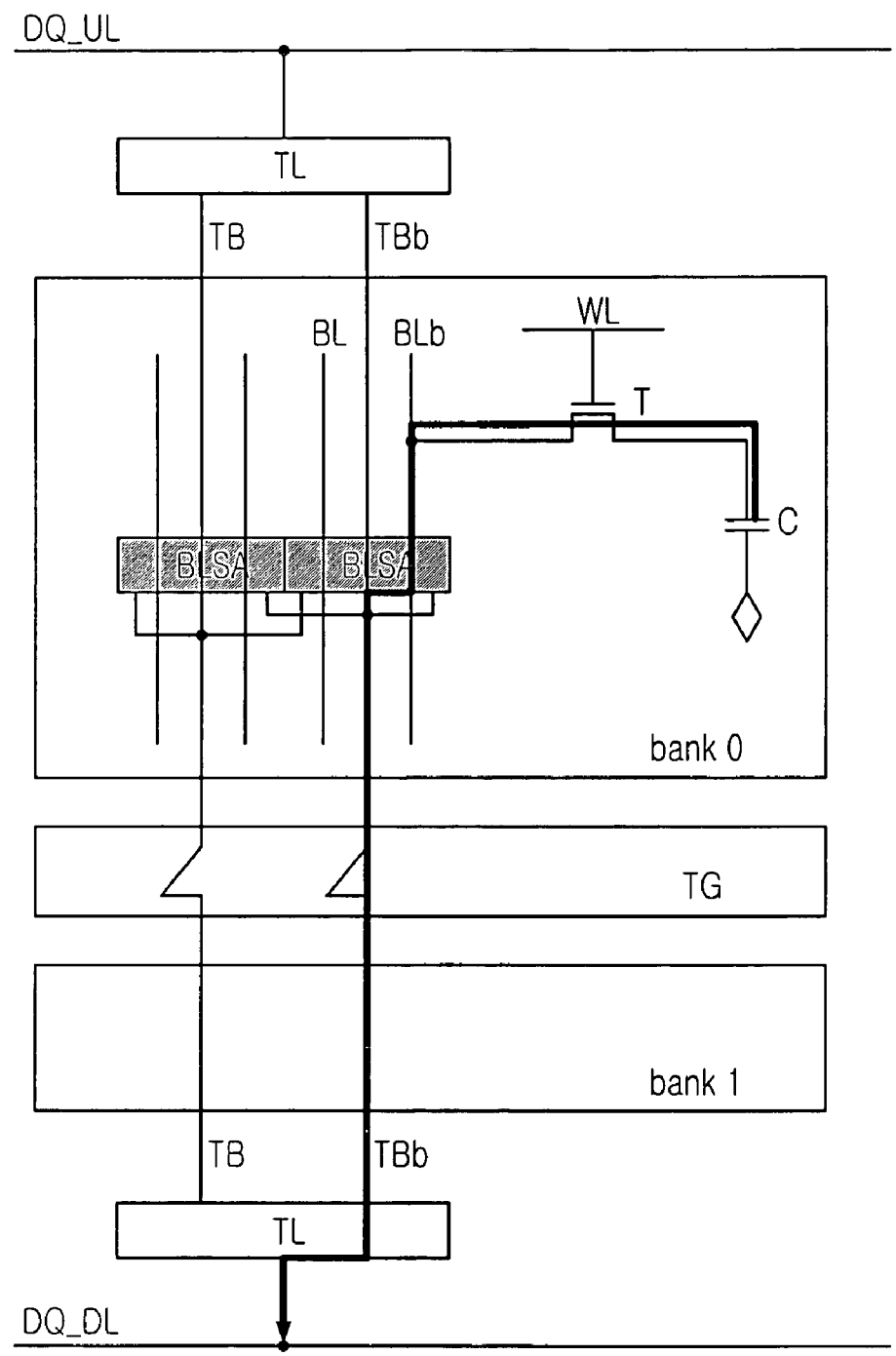
FIG. 4A illustrates a cross read path of the 256M multi-port DRAM depicted in FIG. 2.
Figure 4B:
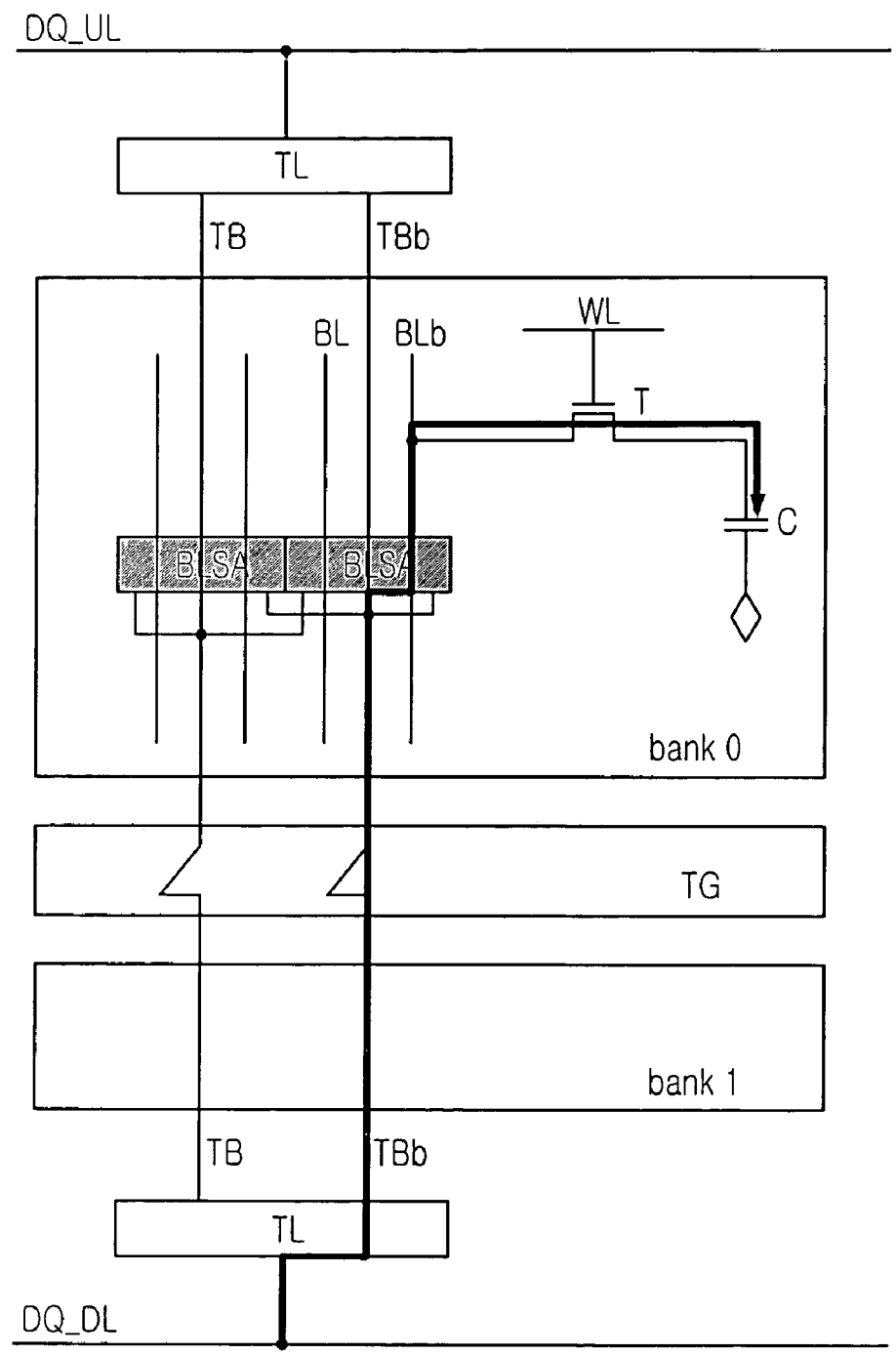
FIG. 4B illustrates a cross write path of the 256M multi-port DRAM depicted in FIG. 2.
Figure 5:
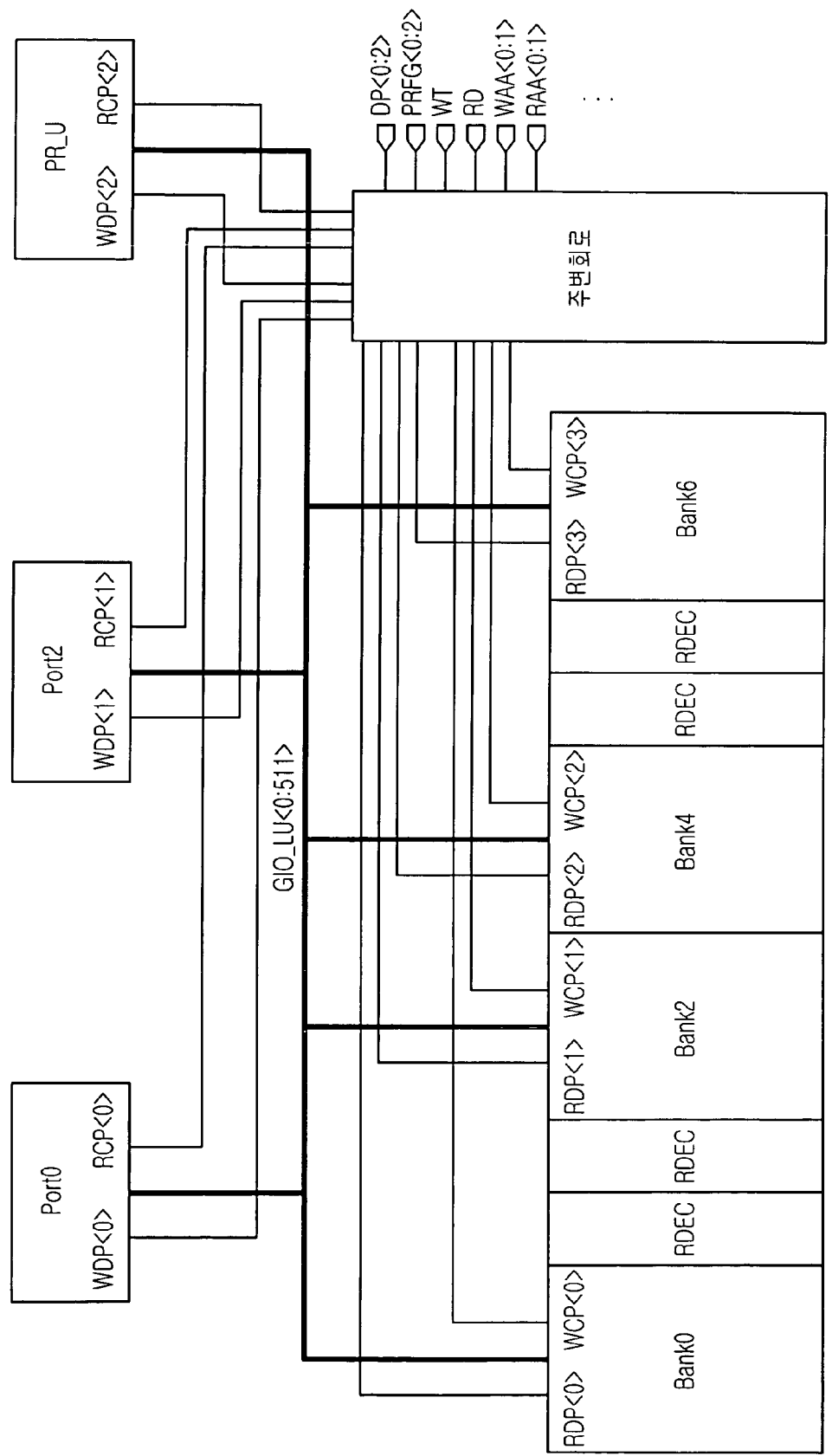
FIG. 5 illustrates a simplified first quadrant of the 256M multi-port DRAM shown in FIG. 1.
Figure 6:
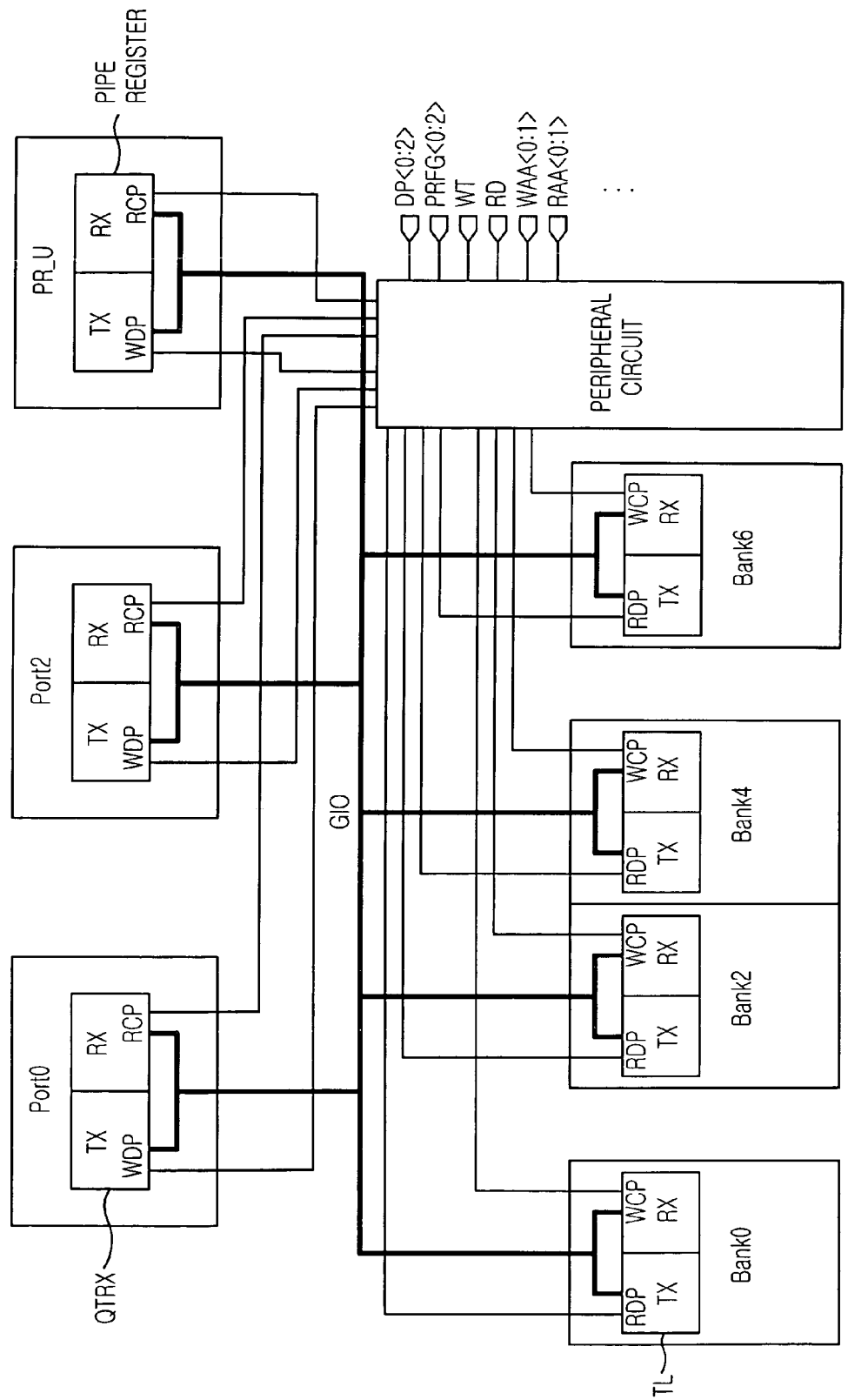
FIG. 6 illustrates a transmission structure of 1-bit data in the first quadrant shown in FIG. 5.
Figure 7:
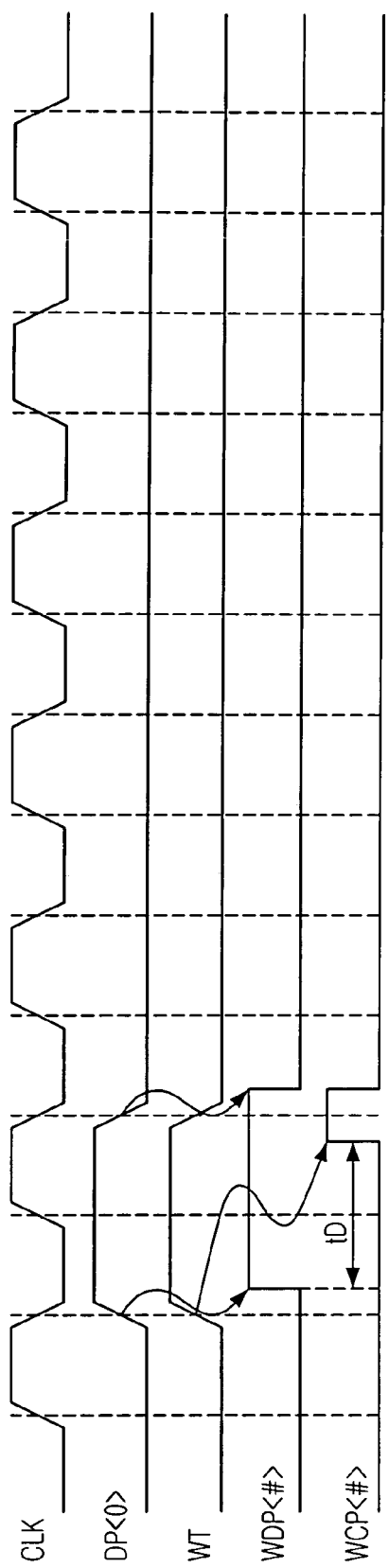
FIG. 7 is a timing diagram in case when a port-bank write operation is performed in the circuit shown in FIG. 6 (a best case)
Figure 10:
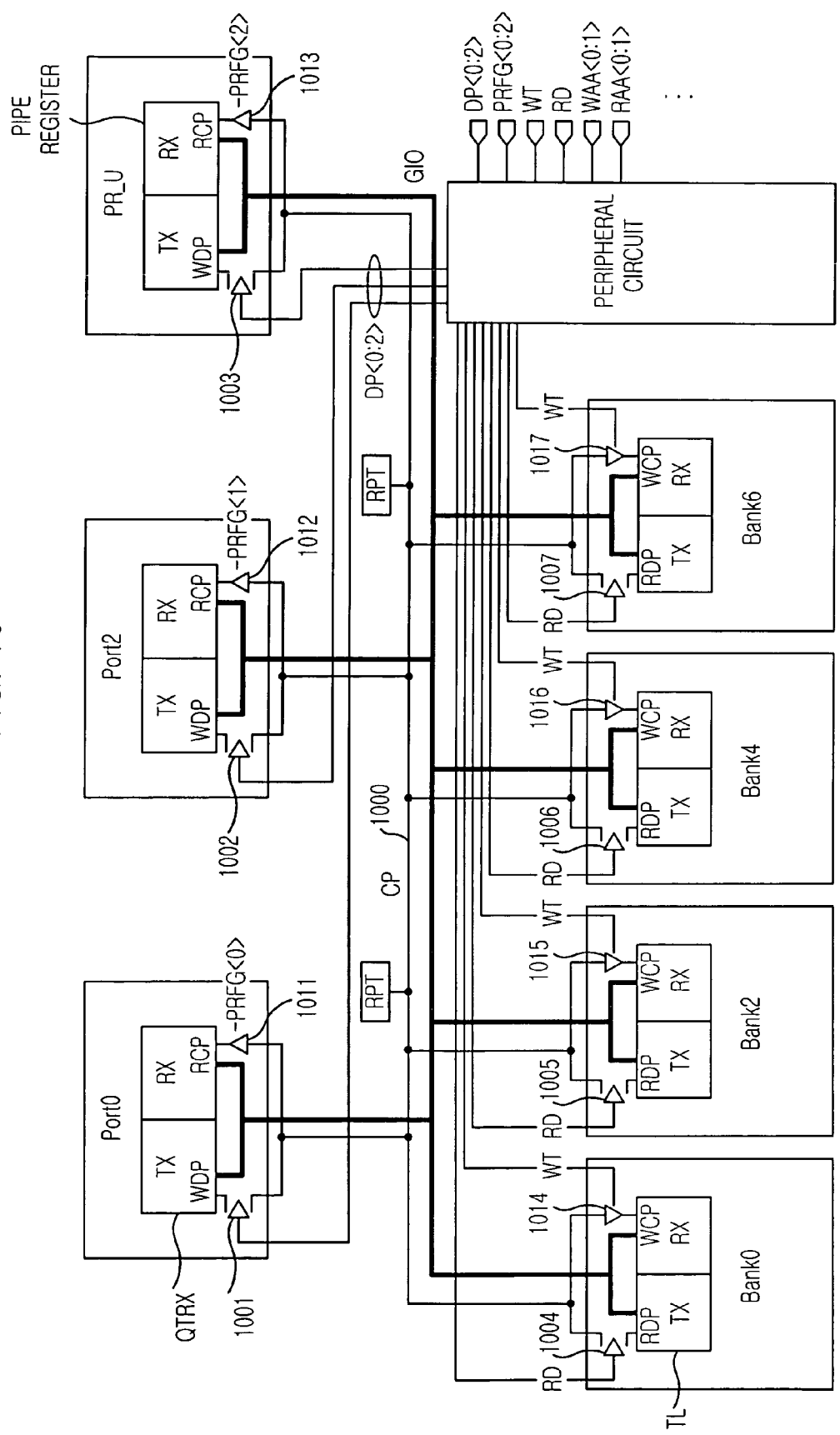
FIG. 10 illustrates a transmission structure of 1-bit data in the first quadrant of a synchronous multi-port memory device in accordance with an embodiment of the present invention.

FIG. 10 illustrates a transmission structure of 1-bit data in a first quadrant of a synchronous multi-port memory device in accordance with an embodiment of the present invention.

Referring to FIG. 10, each bank bank0, bank2, bank4 and bank6, each port port0 and port2 and the global data bus connection block PR_U include a transmitter TX and a receiver RX, which transmit and receive data to and from the global data bus GIO, respectively. In other words, the bank includes a transfer latch that is a unit block of the bus connection unit TL, and the port includes a transmitter and a receiver that are unit block of data transmission unit QTRX. The global data bus connection block PR_U includes a bi-directional pipe register that is a unit block to perform a transmission/reception operation.

At the first quadrant, the synchronous multi-port memory device in accordance with an embodiment of the present invention includes: the global data bus GIO; a plurality of data transmission/reception blocks having the transmitter TX and receiver RX for transmitting and receiving data to and from the global data bus GIO, respectively; the ports port0 and port2; the banks bank0, bank2, bank4 and bank6; the global data bus connection block PR_U; data driving/capture pulse generators 1001, 1002, 1003, 1004, 1005, 1006 and 1007, arranged at each data transmission/reception block, for generating data driving pulses WDP and RDP for the transmitter TX of the corresponding data transmission/reception block and data capture pulse CP for the receiver RX of other data transmission/reception block in response to internal signals DP<0:2> outputted from a peripheral circuit; a data capture pulse bus 1000 for transmitting the data capture pulse CP between the data transmission/reception blocks; and data capture pulse receivers 1011 to 1017, arranged at each data transmission/reception block, for transmitting the data capture pulse of the data capture pulse bus to the receiver of the corresponding data transmission/reception block in response to internal signals (WT) PRFG<0:2> provided from the peripheral circuit.

Also, at least one bi-directional repeater RPT may be connected to the data capture pulse bus 1000.

Here, the data driving/capture pulse generators 1001, 1002 and 1003 arranged at the port port0 and port2 and the global data bus connection block PR_U receive data driving signals DP<0:2> for port/global data bus connection block and generate data write driving pulse WDP for the transmitter TX of the corresponding port or global data bus connection block. Also, the data driving/capture pulse generators 1001, 1002 and 1003 generate the data capture pulse CP for the receivers RX of the banks bank01 bank2, bank4 and bank6 in response to the write data driving pulse RDP.

Data driving/capture pulse generators 1004, 1005, 1006 and 1007 arranged at the banks bank0, bank2, bank4 and bank6 receive read command signal RD and generate read data driving pulse RDP for the transmitters TX of the corresponding banks, and also generate data capture pulse CP for the receivers RX of other data transmission/reception blocks (ports or global data bus connection blocks) in response to the read data driving pulse RDP.

The data capture pulse receivers 1011, 1012 and 1013 arranged at the ports port0 and port2 and the global data bus connection block PR_U receive the data capture pulse CP of the data capture pulse bus 1000 in response to flag signals PRFG<0:2> for the port/global data bus connection block, and generate read data capture pulse RCP for the receivers RX of the corresponding ports or global data bus connection block.

Also, the data capture pulse receivers 1014, 1015, 1016 and 1017 arranged at the banks bank0, bank2, bank4 and bank6 receive the data capture pulse CP of the data capture pulse bus 1000 in response to the write command signal WT and generate write data capture pulse WCP for the receivers RX of the corresponding banks.

Figure 11:
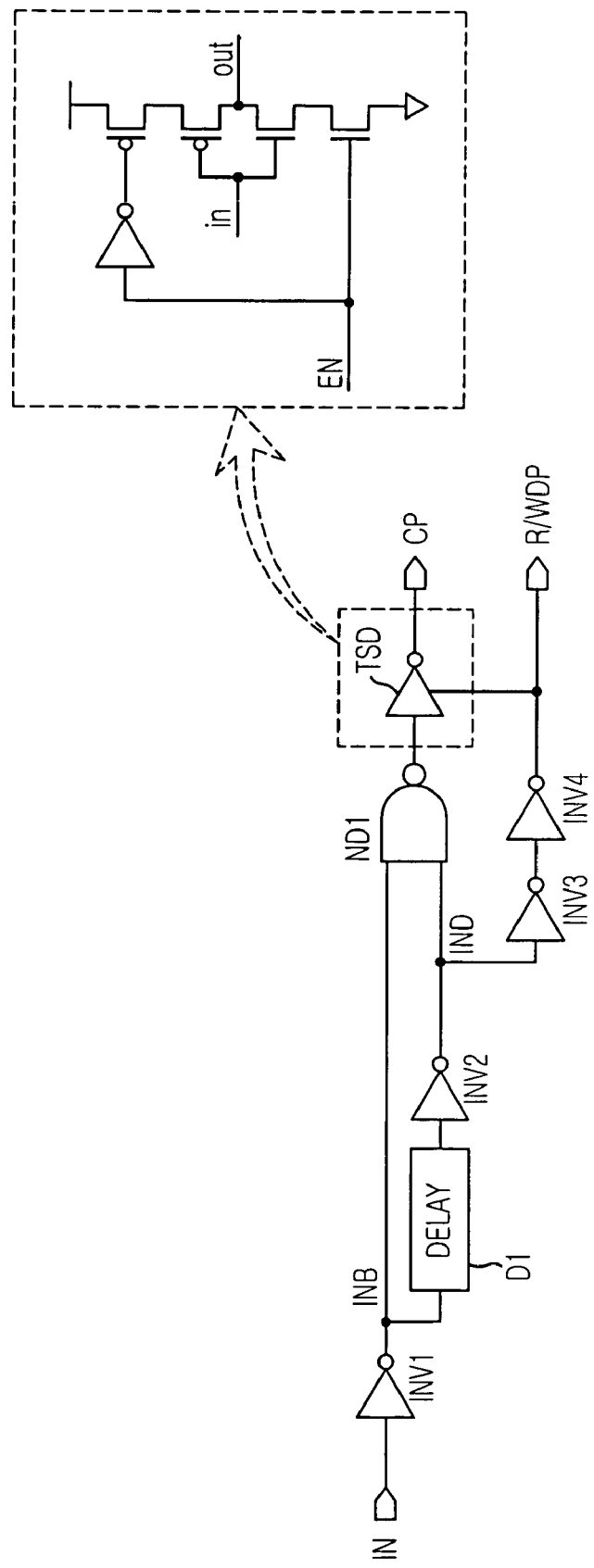
FIG. 11 is a circuit diagram of a data driving/capture pulse generator shown in FIG. 10.

FIG. 11 is a circuit diagram of the data driving/capture pulse generator shown in FIG. 10.

Referring to FIG. 11, the data driving/capture pulse generator 1001 to 1007 includes: an inverter INV1 for inverting an input signal IN; a delay unit D1 for delaying an output INB of the inverter INV1; an inverter INV2 for inverting an output of the delay unit D1; a NAND gate ND1 having input terminals receiving the outputs INB and IND of the first and second inverters INV1 and INV2; an inverter INV3 for inverting an output IND of the inverter INV2; an inverter INV4 for receiving an output of the inverter INV3 and generating the data driving pulse R/WDP; and a tri-state driver (TSD) for inverting the output of the NAND gate ND1 in response to the data driving pulse R/WDP to generate the data capture pulse CP, and driving the data capture pulse bus 1000.

Since a configuration of the tri-state driver (TSD) is well known, its detailed description will be omitted. Here, the data driving pulse R/WDP is used as an enable signal EN of the tri-state driver (TSD).

Figure 12:
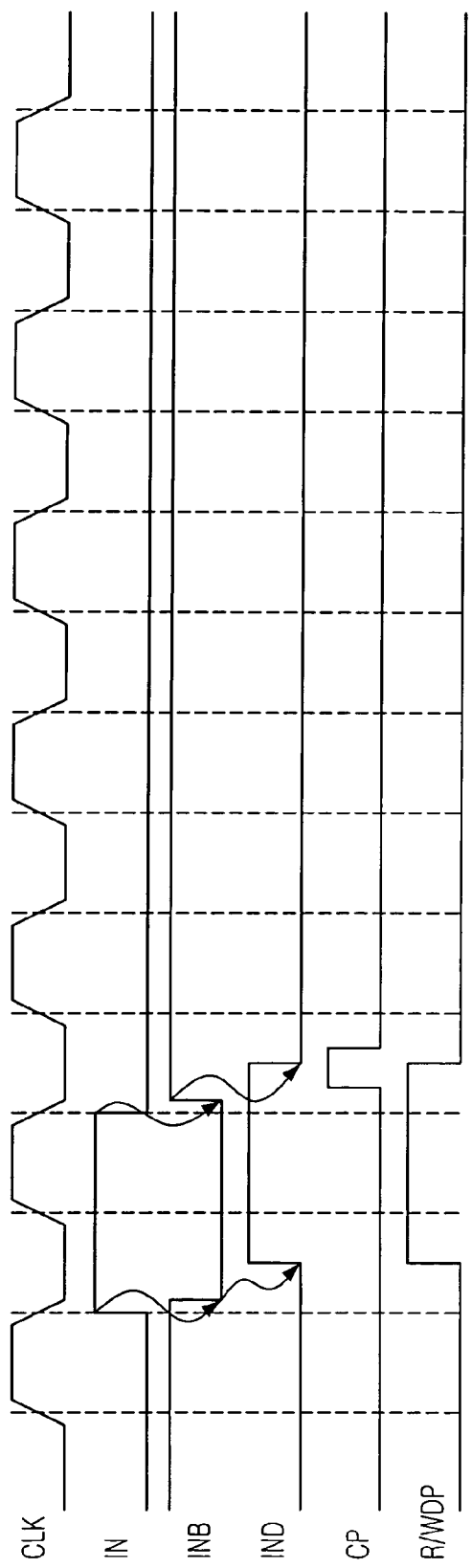
FIG. 12 is a timing diagram of the data driving/capture pulse generator shown in FIG. 11.

FIG. 12 is a timing diagram illustrating the data driving/capture pulse generator shown in FIG. 11.

Referring to FIG. 11, the data driving/capture pulse generator delays the read command signal RD or the data driving signals DP<0:2> to generate the data driving pulse R/WDP. Also, using the tri-state driver (TSD), the data driving/capture pulse generator delays the pulse, which is generated using the input signal IN, to generate the data capture pulse CP.

The reason why the tri-state driver (TSD) is used is that level collision occur when the data capture pulse bus 1000 is driven at the plurality of data transmission/reception blocks at the same time. In other words, if the data driving pulse R/WDP is activated in one data transmission/reception block, the data driving pulse R/WDP is inactivated in the remaining data transmission/reception blocks. Therefore, if the data driving pulse R/WDP is used as the enable signal of the tri-state driver (TSD), the data capture pulse bus 1000 is driven at only one data transmission/reception block.

If the data driving pulse R/WDP for the transmitter TX of the corresponding data transmission/reception block is activated in response to the internal signals RD and DP<0:2> provided from the peripheral circuit, data are loaded on the global data bus GIO from the transmitter TX of the corresponding data transmission/reception block after a predetermined time. At the same time, the data capture pulse CP generated from the corresponding data transmission/reception block is loaded on the capture pulse bus 1000.

Figure 13:
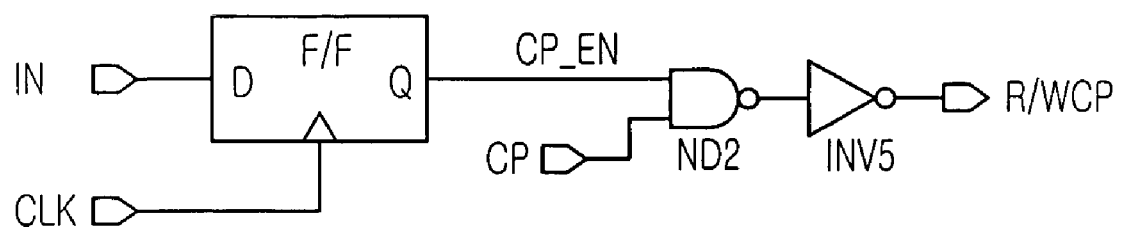
FIG. 13 is a circuit diagram of the data capture pulse receiver shown in FIG. 10.

FIG. 13 is a circuit diagram of the data capture pulse receiver 1011 to 1017 shown in FIG. 10.

Referring to FIG. 13, the data capture pulse receiver includes: a D flip-flop for latching an input signal IN in synchronization with a clock signal CLK; a NAND gate ND2 having input terminals receiving an output CP_EN of the D flip-flop and the data capture pulse CP; and an inverter INV5 for inverting an output of the NAND gate ND2 to output the data capture pulse R/WCP for the receiver RX of the corresponding data transmission/reception block.

Figure 14:
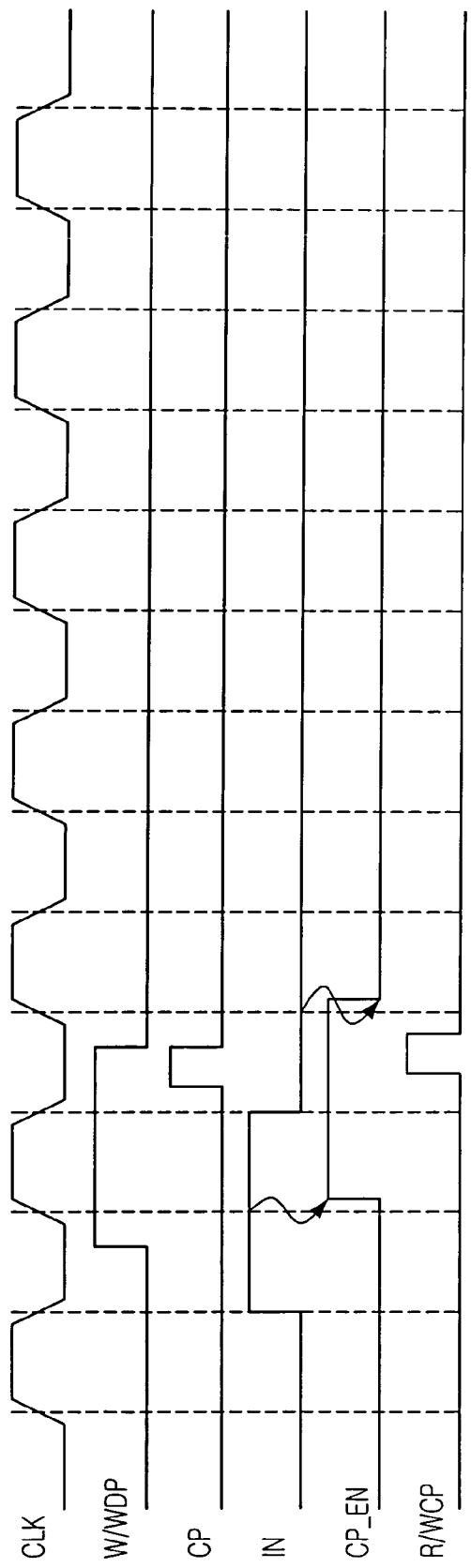
FIG. 14 is a timing diagram of the data capture pulse receiver shown in FIG. 13.

FIG. 14 is a timing diagram illustrating the data capture pulse receiver shown in FIG. 13.

Referring to FIG. 14, the data capture pulse receiver synchronizes the flag signals PRFG<0:2> or the write command signal WT with the clock signal CLK to generate the data capture pulse enable signal CP_EN. Also, the data capture pulse receiver receives the data capture pulse CP from the data capture pulse bus 1000 at the active section of the data capture pulse enable signal CP_EN and uses it as the data capture pulse R/WCP for the receiver RX of the corresponding data transmission/reception block. The data capture pulse R/WCP enables the receiver RX of the corresponding data transmission/reception block, thus allowing the data of the global data bus GIO to be captured at the corresponding data transmission/reception block.

Referring again to FIG. 10, the bi-directional repeater RPT is connected among the data capture pulse buses 1000. The reason why the repeater is provided at the data capture pulse buses 1000 is that the data capture pulse buses 1000 are the long buses arranged globally all over the chip, like the global data bus GIO. Also, the repeater is used because the data capture pulse CP is transmitted in a bi-direction together with the data.

Figure 15:
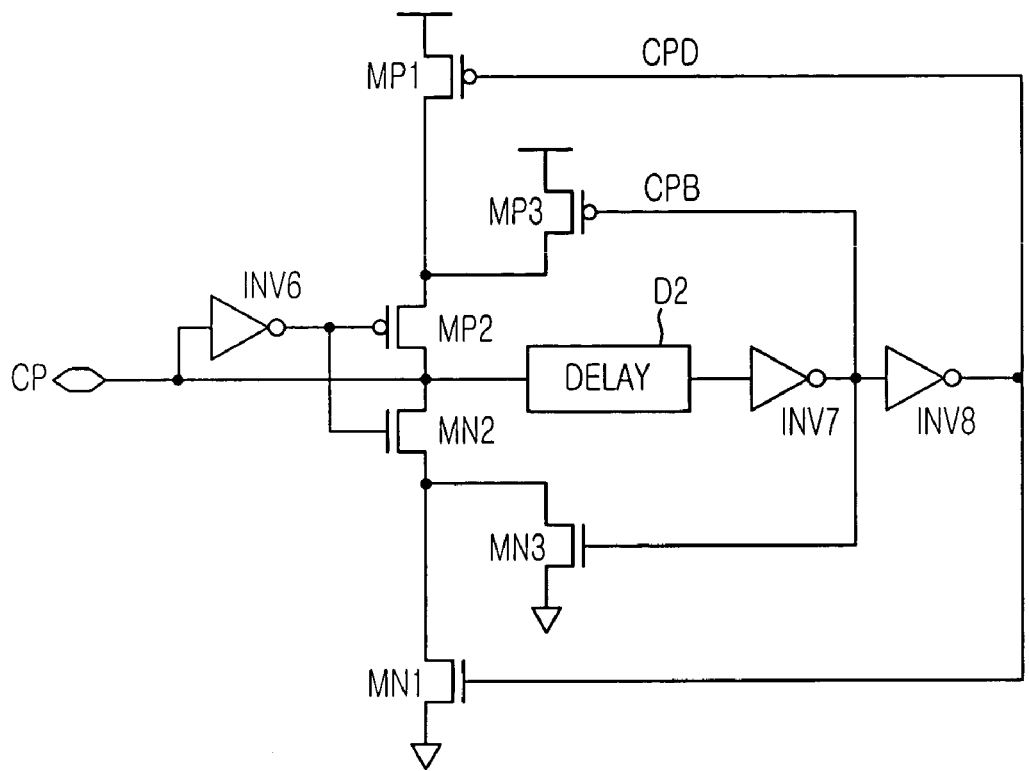
FIG. 15 is a circuit diagram of the bi-directional repeater shown in FIG. 10.
Figure 16:
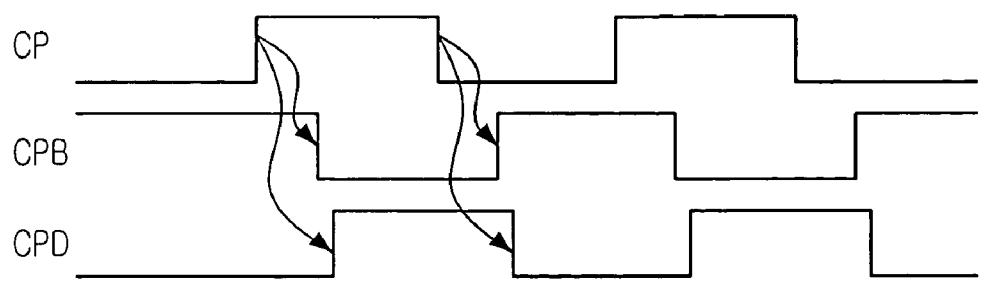
FIG. 16 is a timing diagram of the bi-directional repeater shown in FIG. 15.

FIG. 15 is a circuit diagram of the bi-directional repeater RPT shown in FIG. 10, and FIG. 16 is a timing diagram of the bi-directional repeater shown in FIG. 15.

Referring to FIG. 15, the bi-directional repeater includes a plurality of inverters INV6, INV7 and INV8, a plurality of MOS transistors MP1, MP2, MP3, MN1, MN2 and MN3, and a delay unit D2. Generally, the MOS transistors MP1 and MN1 are larger in size than the MOS transistors MP3 and MN3.

Referring to FIG. 16, the bi-directional repeater again drives the data capture pulse CP, which is weakened because it operates only at rising edges of the data capture pulse CP. In this manner, the data transmission/reception block can receive the data capture pulse CP without any distortion.

Since such a bi-directional repeater is well known, its detailed configuration and operation will be omitted.

Although only the first quadrant of the synchronous multi-port memory device is described in the embodiments, a configuration of the other quadrants is identical to that of the first quadrant. Considering the basic characteristic of the multi-port memory device, which is accessible to all banks at all ports, the data capture pulse buses 1000 are not present separately at every quadrant but arranged globally all over the chip.

The number of ports, the number of banks and so on may be changed depending on the capacity of the memory device.

As described above, the present invention can prevent the skew occurring between the data and the data strobe signal according to the data transmission path. In other words, a position dependent characteristic can be eliminated. Therefore, characteristics of variation in the process, temperature and voltage or noise can be strengthened, thereby securing a more stable operation characteristic. Specifically, as the memory capacity is larger, the skew problem in the data transmission path will be a more important issue. Thus, it is very useful to apply the present invention to next generation memory products or multi-port memory devices.

The present application contains subject matter related to Korean patent applications No. 2004-31909, filed in the Korean Patent Office on May 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A synchronous semiconductor memory device, comprising:
a global data bus;
a plurality of data transmission/reception block including a transmitter and a receiver for transmitting and receiving data to and from the global data bus, respectively;
a data driving/capture pulse generating means, arranged at each data transmission/reception block, for generating data driving pulse for a transmitter of a corresponding data transmission/reception block and data capture pulse for a receiver of other data transmission/reception block in response to internal signals provided from a peripheral circuit;
a data capture pulse bus for transmitting the data capture pulse among the plurality of data transmission/reception blocks; and
a data capture pulse receiving means, arranged at each data transmission/reception block, for transmitting the data capture pulse of the data capture pulse bus to a receiver of a corresponding data transmission/reception block in response to internal signals provided from the peripheral circuit.

2. The synchronous memory device as recited in claim 1, further comprising at least one bi-directional repeater, which is connected to the data capture pulse bus.

3. A synchronous multi-port memory device, comprising:
a global data bus;
a plurality of data transmission/reception block including a transmitter and a receiver for transmitting and receiving data to and from the global data bus, respectively, a plurality of ports, a plurality of banks, and a global data bus connection block;
a data driving/capture pulse generating means, arranged at each data transmission/reception block, for generating data driving pulse for a transmitter of a corresponding data transmission/reception block and data capture pulse for a receiver of other data transmission/reception block in response to internal signals provided from a peripheral circuit;
a data capture pulse bus for transmitting the data capture pulse among the plurality of data transmission/reception blocks; and
a data capture pulse receiving means, arranged at each data transmission/reception block, for transmitting the data capture pulse of the data capture pulse bus to a receiver of a corresponding data transmission/reception block in response to internal signals provided from the peripheral circuit.

4. The synchronous multi-port memory device as recited in claim 3, further comprising at least one bi-directional repeater, which is connected to the data capture pulse bus.

5. The synchronous multi-port memory device as recited in claim 4, wherein the data driving/capture pulse generating means arranged at the plurality of ports and the global data bus connection block receives a data driving signal, generates write data driving pulse to the transmitter of a corresponding port or global data bus connection, and generates the data capture pulse for the receiver of other data transmission/reception block in response to the write data driving pulse.

6. The synchronous multi-port memory device as recited in claim 4, wherein the data driving/capture pulse generating means arranged at the plurality of banks receives read command signal, generates read data driving pulse for the transmitter of a corresponding bank, and generates the data capture pulse for the receiver of other data transmission/reception block in response to the read data driving pulse.

7. The synchronous multi-port memory device as recited in claim 4, wherein the data capture pulse receiving means arranged at the plurality of ports and the global data bus connection block receives the data capture pulse of the data capture pulse bus in response to a flag signal and generates read data capture pulse for the receiver of the corresponding port or global data bus connection block.

8. The synchronous multi-port memory device as recited in claim 4, wherein the data capture pulse receiving means arranged at the plurality of banks receives the data capture pulse of the data capture pulse bus in response to write command signal and generates write data capture pulse for the receiver of the corresponding bank.

9. The synchronous multi-port memory device as recited in claim 5, wherein the data driving/capture pulse generating means arranged at the plurality of ports and the global data bus connection block includes:
- a first inverter for inverting the data driving signal for the port/global data bus connection block;
- a delay unit for delaying an output of the first inverter;
- a second inverter for inverting an output of the delay unit;
- a NAND gate having input terminals receiving the outputs of the first and second inverters;
- a third inverter for inverting an output of the second inverter;
- a fourth inverter for inverting an output of the third inverter and outputting the write data driving pulse; and
- a tri-state driver for inverting an output of the NAND gate and outputting the data capture pulse in response to the write data driving pulse and driving the data capture pulse bus.

10. The synchronous multi-port memory device ass recited in claim 6, wherein the data driving/capture pulse generating means includes:
- a first inverter for inverting the read command signal;
- a delay unit for delaying an output of the first inverter;
- a second inverter for inverting an output of the delay unit;
- a NAND gate having input terminals receiving the outputs of the first and second inverters;
- a third inverter for inverting an output of the second inverter;
- a fourth inverter for inverting an output of the third inverter and outputting the write data driving pulse; and
- a tri-state driver for inverting an output of the NAND gate and outputting the data capture pulse in response to the read data driving pulse and driving the data capture pulse bus.

11. The synchronous multi-port memory device as recited in claim 7, wherein the data capture pulse receiving means arranged at the plurality of ports and the global data bus connection block includes:
- a flip-flop for latching the flag signal in synchronization with a clock signal;
- a NAND gate having input terminals receiving an output of the flip-flop and the data capture pulse; and
- an inverter for inverting an output of the NAND gate and outputting the read data capture pulse for the receiver of the corresponding port or global data bus connection block.

12. The synchronous multi-port memory device as recited in claim 8, wherein the data capture pulse receiving means arranged at the plurality of banks includes:
- a flip-flop for latching the write command signal in synchronization with a clock signal;
- a NAND gate having input terminals receiving an output of the flip-flop and the data capture pulse; and
- an inverter for inverting an output of the NAND gate and outputting the data capture pulse for the receiver of the corresponding bank.

* * * * *